(12) United States Patent
LoCasio et al.

(10) Patent No.: US 8,409,475 B2
(45) Date of Patent: Apr. 2, 2013

(54) METHOD OF MAKING SEMICONDUCTOR NANOCRYSTAL COMPOSITES

(75) Inventors: Michael LoCasio, Clifton Park, NY (US); Jennifer Gillies, Petersburg, NY (US); Margaret Hines, Troy, NY (US)

(73) Assignee: Evident Technologies, Inc., Troy, NY (US)

( * ) Notice: Subject to any disclaimer, the term of this patent is extended or adjusted under 35 U.S.C. 154(b) by 832 days.

(21) Appl. No.: 11/896,549

(22) Filed: Sep. 4, 2007

(65) Prior Publication Data

US 2008/0237546 A1    Oct. 2, 2008

Related U.S. Application Data

(60) Provisional application No. 60/875,609, filed on Dec. 19, 2006, provisional application No. 60/843,573, filed on Sep. 11, 2006.

(51) Int. Cl.
*H01B 1/14* (2006.01)

(52) U.S. Cl. ............. 252/500; 252/301.4 R; 252/519.4; 252/518.1; 252/584; 252/582; 252/301.6 S; 252/301.6 R; 252/301.4 S; 438/488; 438/584; 428/403

(58) Field of Classification Search ............ 252/500, 252/519.4, 518.1, 584, 582, 301.6 S, 301.6 R, 252/301.4 S, 301.4 R; 428/403; 438/486, 438/584, 488
See application file for complete search history.

(56) References Cited

U.S. PATENT DOCUMENTS

| | | | | |
|---|---|---|---|---|
| 6,962,823 B2* | 11/2005 | Empedocles et al. | ............ | 438/3 |
| 7,118,627 B2* | 10/2006 | Hines et al. | ..................... | 117/68 |
| 7,405,002 B2* | 7/2008 | Ying et al. | .................... | 428/404 |
| 7,850,777 B2* | 12/2010 | Peng et al. | ...................... | 117/68 |
| 2004/0072427 A1* | 4/2004 | Sato et al. | ..................... | 438/689 |
| 2005/0120946 A1* | 6/2005 | Hines et al. | ..................... | 117/68 |
| 2006/0029802 A1* | 2/2006 | Ying et al. | .................... | 428/403 |
| 2007/0012355 A1* | 1/2007 | LoCascio et al. | ............. | 136/252 |
| 2007/0045777 A1* | 3/2007 | Gillies et al. | .................. | 257/613 |
| 2007/0289491 A1* | 12/2007 | Peng et al. | ................. | 106/286.6 |
| 2008/0012001 A1* | 1/2008 | Gillies | .............................. | 257/9 |
| 2008/0173886 A1* | 7/2008 | Cheon et al. | .................... | 257/98 |
| 2008/0230750 A1* | 9/2008 | Gillies et al. | .................. | 252/500 |
| 2008/0246017 A1* | 10/2008 | Gillies et al. | .................... | 257/13 |
| 2010/0267196 A1* | 10/2010 | Weiss et al. | .................... | 438/102 |

OTHER PUBLICATIONS

Hines et al., "Synthesis and Characteriztion of Strongly Luminescing Zn-S-Capped CdSe Nanocrystals", J. Phys. Chem., 1996, 100(2), 468-471.*
Kortan et al., "Nucleation and Growth of CdSe on ZnS Quantum Crystallite Seeds, and Vice Versa, in Inverse Micelle Media", J. Am. Chem. Soc., 1990, 112, 1327-1332.*
Dabbousi et al., "(CdSe)ZnS Core—Shell Quantum Dots: Synthesis and Characterization of a Size Series of Highly Luminescent Nanocrystallites", J. Phys. Chem. B, 1997, 101, 9463-9475.*
Concise Science Dictionary, Oxford University Press, 1984, pp. 319, 348, 349.*

* cited by examiner

*Primary Examiner* — Douglas McGinty
(74) *Attorney, Agent, or Firm* — Hoffman Warnick LLC

(57) ABSTRACT

A semiconductor nanocrystal composite comprising a semiconductor nanocrystal composition dispersed in an inorganic matrix material and a method of making same are provided. The method includes providing a semiconductor nanocrystal composition having a semiconductor nanocrystal core, providing a surfactant formed on the outer surface of the composition, and replacing the surfactant with an inorganic matrix material. The semiconductor nanocrystal composite emits light having wavelengths between about 1 and about 10 microns.

19 Claims, 6 Drawing Sheets

METHOD OF MAKING SEMICONDUCTOR NANOCRYSTAL COMPOSITES

CROSS-REFERENCE TO RELATED APPLICATIONS

The present application claims priority to U.S. Provisional Application Nos. 60/875,609, filed Dec. 19, 2006 and 60/843,573 filed on Sep. 11, 2006, which are both incorporated by reference herein.

FIELD OF THE INVENTION

The present invention relates to semiconductor nanocrystal composites and methods of making the same.

BACKGROUND OF THE INVENTION

Efficient mid-infrared (mid-IR) light sources and lasers emitting at wavelengths between about 3 and about 5 microns would be desirable enablers for a variety of technologies, including gas analysis, remote sensing, and atmospheric monitoring. However, among current sources, organic laser dyes are poor fluorophores (quantum yields in emission of less than 0.5%) that are confined to the near-infrared (near-IR), while mid-IR emitting rare-earth doped crystals offer limited emission wavelengths and small absorption cross sections. Alternatively, epitaxial quantum wells provide the possibility for efficient, continuously tunable mid-IR emission, but are not chemically processible, according to Hollingsworth, J., and V. Klimov, "Pushing the Band Gap Envelope: Mid-Infrared Emitting Colloidal PbSe Quantum Dots," *J. Am. Chem. Soc.*, 126, 11752-11753 (2004).

Atmospheric absorption of light primarily due to oxygen, carbon dioxide, and water vapor results in the atmospheric transmission spectra depicted in FIG. 1. As can be identified on the spectra, there exist specific wavelength windows where light can travel long distances without appreciable losses. Aside from visible light, infrared light having wavelengths between about 3 and about 5 microns is generally absorbed little or not at all by the atmosphere. Light of this wavelength range can travel long distances through the atmosphere without being substantially absorbed, thereby making this range attractive in providing efficient mid-IR light sources and lasers.

The relationship between the peak emission wavelength and the temperature of a black body is defined by Wien's displacement law (Equation 1), which states:

$$\lambda_{max} = \frac{b}{T}, \quad (1)$$

where $\lambda_{max}$ is the peak wavelength of the black body in meters (m), T is the temperature of the black body in degrees Kelvin (K), and b is a constant of proportionality called Wien's displacement constant and equals 2.8977685(51)×1-3 m·K. The parenthesized digits in b denote the uncertainty in the two least significant digits, where uncertainty is measured as the standard deviation at 68.27% confidence level.

Wien's displacement constant b equals 2.8977685(51)× $10^6$ nm·K, when defined in units of nanometers (nm) rather than meters (m), as is typically done for optical wavelengths.

Basically, Wien's displacement law shows that the higher the object's temperature, the shorter the wavelength at which the object's peak emissions occur. For example, the sun's surface temperature is 5778 K and the sun's peak emission wavelength is 502 nm, which is about midway the visual light spectrum. This is why the visible light emitted by the sun is basically white light. As the light hits the Earth's atmosphere, it is subject to Rayleigh scattering, which results in an observed blue sky and yellow sun.

Wien's displacement law in the frequency domain (Equation 2) states:

$$f_{max} = \frac{\alpha k}{h} T \approx (5.879 \times 10^{10} \text{ Hz/K}) \cdot T, \quad (2)$$

where $f_{max}$ is the peak emission frequency of the black body in hertz (Hz), a 2.821439 . . . , a constant resulting from the numerical solution of the maximization equation, k is Boltzmann's constant, h is Planck's constant, and T is the temperature of the black body in degrees Kelvin (K).

In terms of Boltzmann's constant k, and Planck's constant h, Wien's displacement law (Equation 3) becomes:

$$\lambda_{max} = \frac{hc}{kx} \frac{1}{T} = \frac{2.89776829 \ldots \times 10^6 \text{ nm} \cdot \text{K}}{T}, \quad (3)$$

where $\lambda_{max}$ is the peak emission wavelength of the black body in nanometers (nm), h is Planck's constant, c≈3.0×$10^8$ m/s, the speed of light, k is Boltzmann's constant, x≈ 4.96511 . . . , a dimensionless constant, and T is the temperature of the black body in degrees Kelvin (K).

Hence, Wien's displacement law may be used to determine at what temperature a light source may emit light at wavelengths within the 3 to 5 micron range or vice versa.

Research conducted at Los Alamos by Hollingsworth and Klimov has shown that semiconductor nanocrystals of the appropriate size and composed of a sufficiently small bandgap semiconductor lead selenide (PbSe) can emit, e.g., exhibit photoluminescence, in the mid-IR wavelengths (they demonstrated peak emission at wavelengths as long as 4 microns) when illuminated with a shorter wavelength source. However, the quantum yield (i.e., the percent of absorbed photons that are reemitted as photons) was very poor (less than 1% compared to greater than 50% for shorter wavelength emitters) due to strong mid-IR absorption of the organic surfactants that surround each semiconductor nanocrystal. Further, water, carbon dioxide and hydroxide groups found in organic surfactants have some absorption in mid as well as near infrared wavelengths.

Semiconductor nanocrystals are typically crystalline particles of II-VI, III-V, or II-VI semiconductor material consisting of hundreds to thousands of atoms. They are neither atomic nor bulk semiconductors, but may best be described as artificial atoms. Their properties originate from their physical size, which ranges from approximately 10 to 100 Å ($10^{-10}$ meters) in radius and is often comparable to or smaller than the bulk exciton Bohr radius. As a consequence, semiconductor nanocrystals no longer exhibit their bulk parent optical or electronic properties. Instead, they exhibit electronic properties due to what are commonly referred to as quantum confinement effects. These effects originate from the spatial confinement of intrinsic carriers (electrons and holes) to the physical dimensions of the material rather than to bulk length scales. One of the better-known confinement effects is the increase in semiconductor bandgap energy with decreasing particle size; this manifests itself as a size dependent blue shift of the band edge absorption and luminescence emission with decreasing particle size.

As nanocrystals increase in size past the exciton Bohr radius, they become electronically and optically bulk-like. Therefore nanocrystals should not be made to have a smaller bandgap than exhibited by the bulk materials of the same composition, which means that the longest wavelength that can be emitted by a nanocrystal is equivalent to the bulk bandgap energy.

Each individual nanocrystal emits a light with a line width comparable to that of atomic transitions. Any macroscopic collection of nanocrystals, however, emits a line that is inhomogeneously broadened due to the fact that every collection of nanocrystals is unavoidably characterized by a distribution of sizes. For example, in a collection of CdSe, InGaP, and PbS nanocrystals with size distributions exhibiting roughly a minimum 5% variation in nanocrystal volume, the width of the inhomogeneously broadened line corresponds to ~35 nm for CdSe, ~70 nm for InGaP, and ~100 nm for PbS.

The absorption spectra of nanocrystals are dominated by a series of overlapping peaks with increasing absorption at shorter wavelengths. Each peak corresponds to excitonic energy level, where the first exciton peak (i.e. the lowest energy state) is synonymous with the blue shifted band edge. Short wavelength light that is absorbed by the nanocrystals will be down converted and reemitted at a shorter wavelength. The efficiency at which this down conversion process occurs is denoted by the quantum yield. Nonradiative exciton recombination reduces quantum yield and is due to the presence of interband states resulting from dangling bonds at the nanocrystal surface and intrinsic defects.

Accordingly, there is a need in the art to develop a stable semiconductor nanocrystal that is brightly fluorescing at shorter peak emission wavelengths.

SUMMARY OF THE INVENTION

The present invention provides semiconductor nanocrystal composites that emit light in the near-IR, short-IR and/or mid-IR portion of the electromagnetic spectrum when excited and exhibit sufficient quantum yield. In an embodiment, the present invention provides a semiconductor nanocrystal composite comprising a semiconductor nanocrystal composition dispersed in an inorganic matrix material, where the semiconductor nanocrystal composite emits light having wavelengths between about 1 and about 10 microns.

In another embodiment, the present invention provides a method of making a semiconductor nanocrystal composite. The method comprises providing a semiconductor nanocrystal composition having a semiconductor nanocrystal core, providing a surfactant formed on the outer surface of the composition, and replacing the surfactant with an inorganic matrix material.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention provides semiconductor nanocrystal composites that emit light in the near-IR, short-IF and/or mid-IR portion of the electromagnetic spectrum when excited and exhibit sufficient quantum yield. As is known in the art, the near infrared (NIR) portion of the electromagnetic spectrum generally has a wavelength range of about 0.7 to about 1.0 microns, short-wave infrared (SWIR) generally has a wavelength range of about 1.0 to about 3 microns and mid-wave infrared (MWIR) generally has a wavelength range of about 3 to about 8 micrometers (defined by the atmospheric window and covered by InSb and HgCdTe and partially PbSe)

Figure 1:
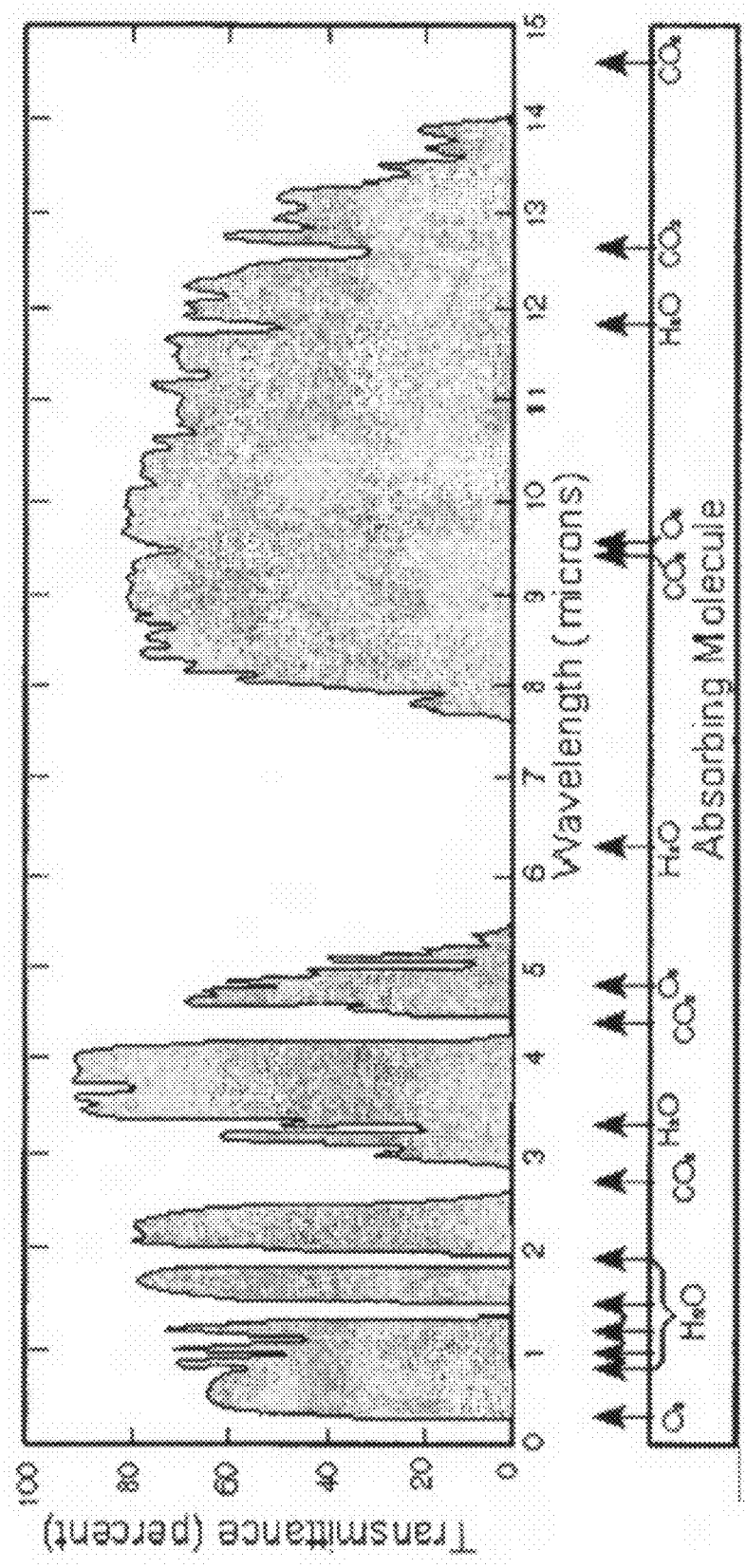
FIG. 1 is a graph showing light transmittance through the atmosphere as a function of wavelength.
Figure 2:
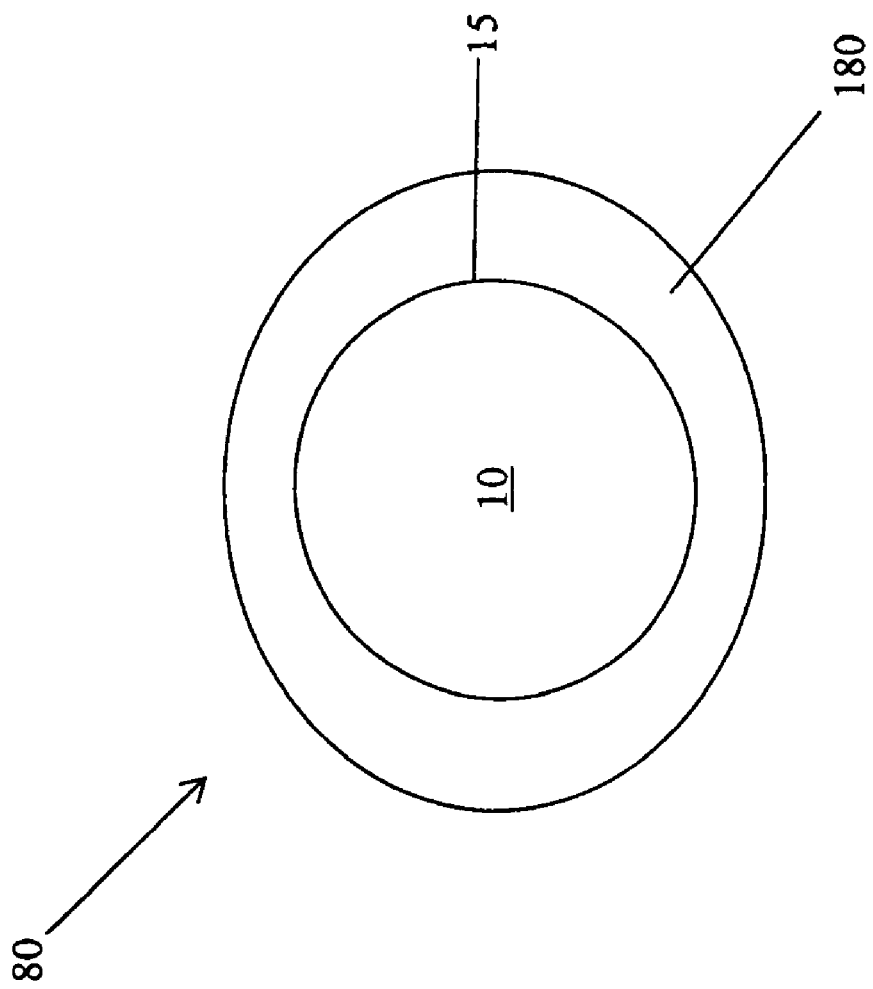
FIG. 2 is a schematic illustration of a semiconductor nanocrystal composite according to an embodiment of the present invention.

Referring to FIG. 2, in an embodiment, the present invention provides a semiconductor nanocrystal composite 80 comprising a semiconductor nanocrystal composition 70 having a semiconductor nanocrystal core 10 (also known as a semiconductor nanoparticle or semiconductor quantum dot) with an outer surface 15, the semiconductor nanocrystal composition being dispersed in an inorganic matrix material 180.

Semiconductor nanocrystal core 10 may be a spherical nanoscale crystalline material (although oblate and oblique spheroids can be grown as well as rods and other shapes) having a diameter of less than the Bohr radius for a given material and typically but not exclusively comprises II-IV, III-V, or IV-VI binary semiconductors. Non-limiting examples of semiconductor materials that semiconductor nanocrystal core 10 can comprise include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials). In addition to binary semiconductors, semiconductor nanocrystal core 10 may comprise ternary, quaternary, or quintary semiconductor materials. Non-limiting examples of ternary, quaternary, or quintary semiconductor materials include $A_xB_yC_zD_wE_{2v}$ wherein A and/or B may comprise a group I and/or VII element, and C and D may comprise a group III, II and/or V element although C and D cannot both be group V elements, and E may comprise a VI element, and x, y, z, w, and v are molar fractions between 0 and 1.

A semiconductor nanocrystal composite, according to the present invention, is electronically and chemically stable with a high luminescent quantum yield. Chemical stability refers to the ability of a semiconductor nanocrystal composite to resist fluorescence quenching over time in aqueous and ambient conditions. Preferably, the semiconductor nanocrystal composite resists fluorescence quenching for at least a week, more preferably for at least a month, even more preferably for at least six months, and even more preferably for at least a year. Electronic stability refers to whether the addition of electron or hole withdrawing ligands substantially quenches the fluorescence of the semiconductor nanocrystal composite. Preferably, a semiconductor nanocrystal composite would also be colloidally stable in that when suspended in organic or aqueous media (depending on the ligands) they remain soluble over time. In certain embodiments, a high luminescent quantum yield refers to a quantum yield of at least 10%. Quantum yield may be measured by comparison to Rhodamine 6G dye with a 488 excitation source. Preferably, the quantum yield of the semiconductor nanocrystal composite is at least 25%, more preferably at least 30%, still more preferably at least 45%, and even more preferably at least 55%, including all intermediate values therebetween, as measured under ambient conditions. The semiconductor nanocrystal composite of the present invention experiences little loss of fluorescence over time and can be manipulated to be soluble in organic and inorganic solvents as traditional semiconductor nanocrystals.

A semiconductor nanocrystal composite, according to the present invention, also emits light at wavelengths in the near-IR, short-IR and/or mid-IR portion of the electromagnetic spectrum when excited. More specifically, in certain embodiments, a semiconductor nanocrystal composite emits light with a peak wavelength between about 1 and about 10 microns. In preferred embodiments, a semiconductor nanocrystal composite emits light in the mid-IR portion of the electromagnetic spectrum with a peak wavelength between about 3 and about 5 microns. Non-limiting examples of shorter wavelength light sources to illuminate semiconductor nanocrystals of the present invention include UV, visible or near-IR light emitting diodes and laser diodes, deuterium lamps, mercury vapor lamps, sodium lamps, xenon lamps, helium neon lasers, neodymium-doped yttrium aluminum garnet (Nd:YAG) lasers, Titanium:sapphire (Ti:Sapphire) lasers, Alexandrite lasers, Erbium and rare earth doped lasers, and sunlight.

Because the peak emission wavelength of a semiconductor nanocrystal composite is dependent upon both the size and the semiconductor materials that comprise the composite, the longest possible emission wavelength is dependent on the bulk bandgap energy of the semiconductor materials of which the nanocrystals are composed. This is because the quantum confinement of electrons and holes within the nanocrystals results in blue-shifted (i.e., higher energy) bandgap when compared to the bandgap of the nanocrystals' semiconductor materials in bulk form and because the light emissions of the nanocrystals occur at wavelengths corresponding to the bandgap energy. Thus, in order to achieve a peak emission wavelength between about 1 and about 10 microns, the nanocrystals are composed of a semiconductor material having a bandgap less than or equal to 1.24 eV at 1 microns and less than or equal to 0.124 eV at 10 microns. In order to achieve a peak emission wavelength between about 3 and 5 microns, the nanocrystals are composed of a semiconductor material having a bandgap less than or equal to 0.413 eV at 3 microns or less than or equal to 0.248 eV at 5 microns. Non-limiting examples of binary semiconductor materials having a bulk bandgap below 0.413 eV at room temperature include lead sulfide (PbS), lead selenide (PbSe), lead telluride (PbTe), indium antimonide (InSb), mercury telluride (HgTe), tin telluride (SnTe), bismuth selenide (BiSe), and alloys thereof. It is appreciated that, in addition to the above described binary semiconductor materials, additional binary semiconductor materials may be used for the purpose of the present invention. It is further appreciated that ternary, quaternary, or quintary semiconductor materials may be used for the purpose of the present invention.

The emission spectrum of a semiconductor nanocrystal composite is roughly Gaussian (bell shaped) with the wavelength range dependent on both material system and polydispersity of the nanocrystal population. In some embodiments, a full width half maximum (FWHM) in excess of 100 nm has been found. Some portion of the light emitted from the semiconductor nanocrystal composite may have wavelengths between about 1 and about 10 microns even if the peak emission wavelength is shorter than 1 microns or longer than 10 microns, provided that one of the "tails" of the emission spectrum overlaps the 1 to 10 micron band.

Referring again to FIG. 2, semiconductor nanocrystal core 10 of a semiconductor nanocrystal composition may be grown by the pyrolysis of organometallic precursors in a chelating ligand solution or by an exchange reaction using the prerequisite salts in a chelating ligand solution. The chelating ligands are typically lyophilic and have an affinity moiety for the semiconductor materials on the outer surface 15 of the core 10 and another moiety with an affinity toward the solvent, which is usually hydrophobic, that the core 10 is in. Typical examples of chelating ligands include lyophilic surfactant molecules such as Trioctylphosphine oxide (TOPO), Trioctylphosphine (TOP), and Tributylphosphine (TBP).

Typically, during preparation, the semiconductor nanocrystals core 10 is enveloped by a layer of surfactant molecules to form a semiconductor nanocrystal complex. The surfactant molecules have one or more functional groups that bind to the semiconductor materials comprising the outer surface 15 of the semiconductor nanocrystal core 10 (examples of functional groups include phosphine, phosphine oxide, thiol, amine carboxylic acid, etc.) and one or more moieties opposite the outer surface 15 of the semiconductor nanocrystal core 10 with nonpolar functional groups that provide solubility to the nanocrystal core 10 in a given hydrophobic solvent or matrix material. For example, hydrophobic aliphatic, alkane, alicyclic, and aromatic groups on the distal ends of the surfactant may be used to confer solubility of the nanocrystal core 10 in hydrophobic solvents. Alternatively, the surfactant molecules may have one or more functional groups that bind to the outer surface 15 of the semiconductor nanocrystal core 10 and one or more moieties of polar or ionizable functional groups that allow for the dispersal of the nanocrystal core 10 into hydrophilic and aqueous solvents. For example, hydrophilic alkane thiol acids, undecanoic acids, octanoid acids, cysteine, and histidine allow for dispersal of the nanocrystal core 10 in hydrophilic and aqueous solvents. Alternatively, the surfactant molecules may have one or more functional groups that bind to the outer surface 15 of the semiconductor nanocrystal core 10 and one or more moieties of both the hydrophobic and hydrophilic functional groups.

However, these surfactant molecules can strongly absorb near, short and/or mid-IR wavelengths, effectively decreasing the photoluminescence output of the semiconductor nanocrystal composition, i.e., the quantum yield. In particular, the organic portions of the functional groups of the surfactant tend to strongly absorb near, short and/or mid-IR wavelengths. As such, while the nanocrystal composition may emit light at wavelengths of about 1 to about 10 microns, that emission may be effectively masked by the surfactant molecules surrounding the nanocrystal composition. Hence, in certain embodiments of the present invention and with reference to FIG. 2, the surfactant molecules are replaced with an inorganic matrix material 180, which does not substantially absorb near, short and/or mid-IR wavelengths. In preferred embodiments, the surfactant molecules are replaced with an inorganic matrix material 180, which does not substantially absorb mid-IR wavelengths. In certain embodiments, the inorganic matrix material is an inorganic salt. In other embodiments, the inorganic matrix material is an inorganic oxide. In still other embodiments, the inorganic matrix material is a semiconductor material.

In general, inorganic material is desirable in an embodiment of the present invention because the inorganic material may not contain organic cations or anions, which may include covalent bonds having vibrational and bending resonances in near, short and/or mid-IR that may be strongly absorbent at the near, short and/or mid-IR wavelengths. Rather, inorganic material may comprise ordered arrays of oppositely charged ions that may not include bending resonances and that may have vibrational resonance only at far-IR.

Referring again to FIG. 2, the inorganic matrix material 180 includes inorganic material that does not substantially absorb light having wavelengths between about 1 and about 10 microns and preferably between about 3 and about 5 microns or at the shorter wavelengths used to excite the nanocrystal composition. Preferably, when in solution, the inorganic material has a neutral or slightly alkaline pH. Non-limiting examples of suitable materials that may be used in the inorganic matrix material 180 include sodium chloride, sodium phosphate, magnesium fluoride, lithium fluoride, calcium fluoride, barium fluoride, silver bromide, potassium chloride, potassium bromide, thallium bromoiodide (KRS-5), cesium bromide, cesium iodide, zinc sulfide, zinc selenide, silica salts, such as ultraviolet or infrared quartz, germanium salts, glass salts, such as amorphous infrared transmission materials (AMTIR), silicon oxide, silicon dioxide, titania, alumina, ceria, zirconia, zinc oxide. Example semiconductors include, CdSe, CdS, CdTe, ZnS, ZnSe, ZnTe, GaP, GaN, InN, AlN, AlP, InP, and their alloys Si, Ge. You should note that the very earliest work in QD involved the precipitation of QDs from a glass melt resulting in "nanocrystallites" in a silica or borosilicate glass. Furthermore recent research has demonstrated that colloidal QDs can be deposited on a semiconductor substrate then overcoated with a further semiconductor layer by a CVD process. In a preferred embodiment, the inorganic material is a soluble salt that displace the quantum dots and cause them to precipitate along with the salt itself.

In some embodiments, different inorganic matrix materials may be used in combination.

Referring again to FIG. 2, the inorganic matrix material 180 may replace the surfactant on the composition's outer surface 15 of the core 10. To do so, the prepared semiconductor nanocrystal complex, including the semiconductor nanocrystal composition and layer of surfactant molecules, is dispersed preferably in an aqueous solvent that is compatible with the inorganic matrix material. The inorganic matrix material is then dissolved in the aqueous solvent. The inorganic matrix material then substantially replaces the surfactant molecules on the surface of the composition. The inorganic matrix material does not substantially absorb the near, short and mid-IR wavelengths emitted by the semiconductor nanocrystal composition. A semiconductor nanocrystal composite 80 is thereby formed.

Figure 3:
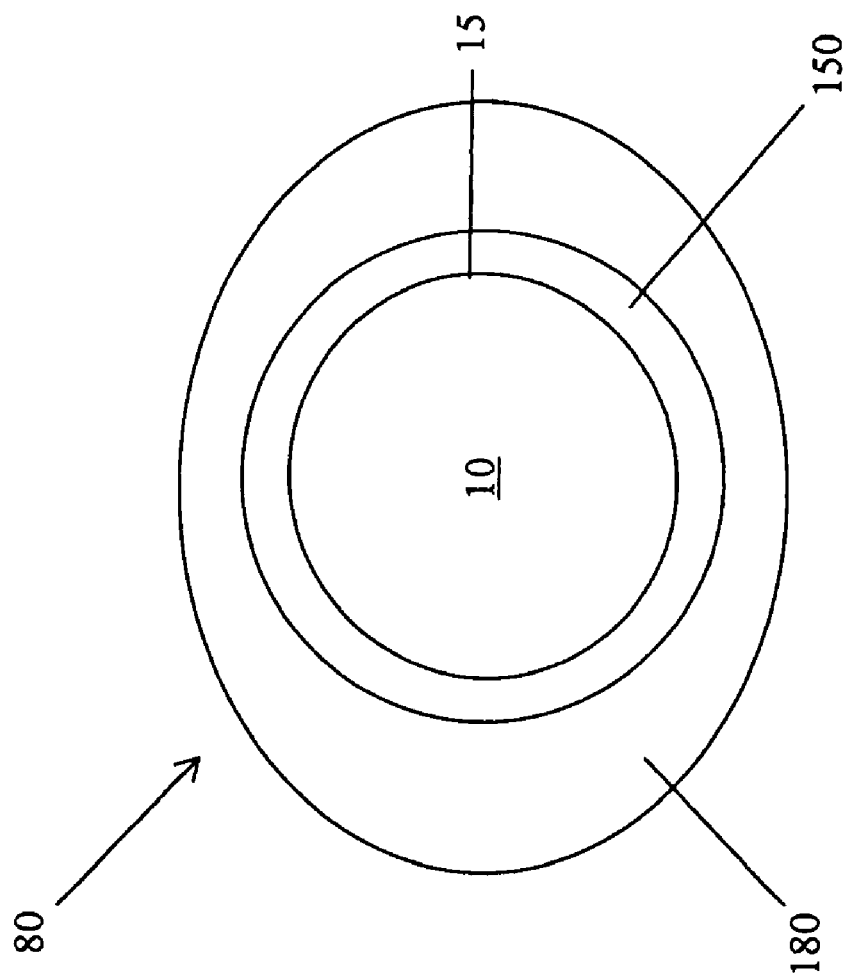
FIG. 3 is a schematic illustration of a semiconductor nanocrystal composite according to another embodiment of the present invention.

Referring to FIG. 3, in an alternate embodiment, the present invention additionally provides for a semiconductor nanocrystal composite comprising a semiconductor nanocrystal composition having a shell overcoating layer 150 grown around the semiconductor nanocrystal core 10, the semiconductor nanocrystal composition being dispersed in an inorganic matrix material 180. The shell 150 is typically between 0.1 nm and 10 nm thick. One or more shells 150 may be grown on the semiconductor nanocrystal core 10. The shell 150 may provide for a type A semiconductor nanocrystal. Shell 150 may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, or PbTe.

The shell 150 may contribute to an increase in the quantum yield (brightness) of the photoluminescent emission from the semiconductor nanocrystal core 10 by occupying dangling bonds and defects that tend to cause nonradiative interband states. Quantum yields may increase to nearly 90% in some circumstances by passivating the surface of the semiconductor nanocrystal core through the addition of a wide bandgap semiconductor shell on the outer surface of the nanocrystal core.

Figure 4:
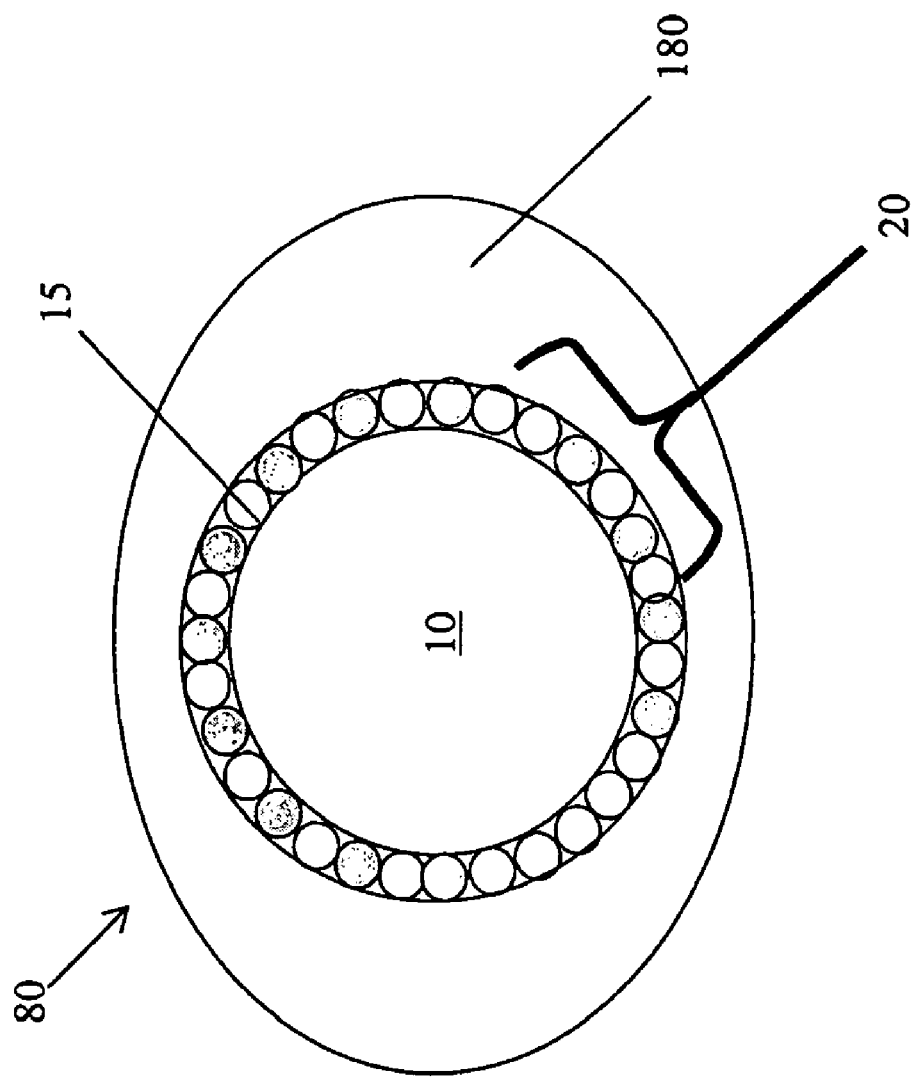
FIG. 4 is a schematic illustration of a semiconductor nanocrystal composite according to still another embodiment of the present invention.

Referring to FIG. 4, in another alternate embodiment, the present invention additionally provides for a semiconductor nanocrystal composite comprising a semiconductor nanocrystal composition having one or more metal layers 20 formed on the outer surface 15 of the core 10 after synthesis of the core, the semiconductor nanocrystal composition being dispersed in an inorganic matrix material 180. The metal layer 20 may act to passivate the outer surface 15 of the semiconductor nanocrystal core 10 and limit the diffusion rate of oxygen molecules to the core 10. The metal layer 20 is typically, although not always, between 0.1 nm and 5 nm thick. The metal layer 20 may include any number, type, combination, and arrangement of metals. For example, the metal layer 20 may be simply a monolayer of metals formed on the outer surface 15 of the core 10 or multiple layers of metals formed on the outer surface 15. The metal layer 20 may also include different types of metals arranged, for example, in alternating fashion. Further, the metal layer 20 may encapsulate the semiconductor nanocrystal core 10 or may be formed on only parts of the outer surface 15 of the core 10. The metal layer 20 may include the metal from which the semiconductor nanocrystal core 10 is made either alone or in addition to another metal. Non-limiting examples of metals that may be used as part of the metal layer include Cd, Zn, Hg, Pb, Al, Ga, or In.

Figure 5:
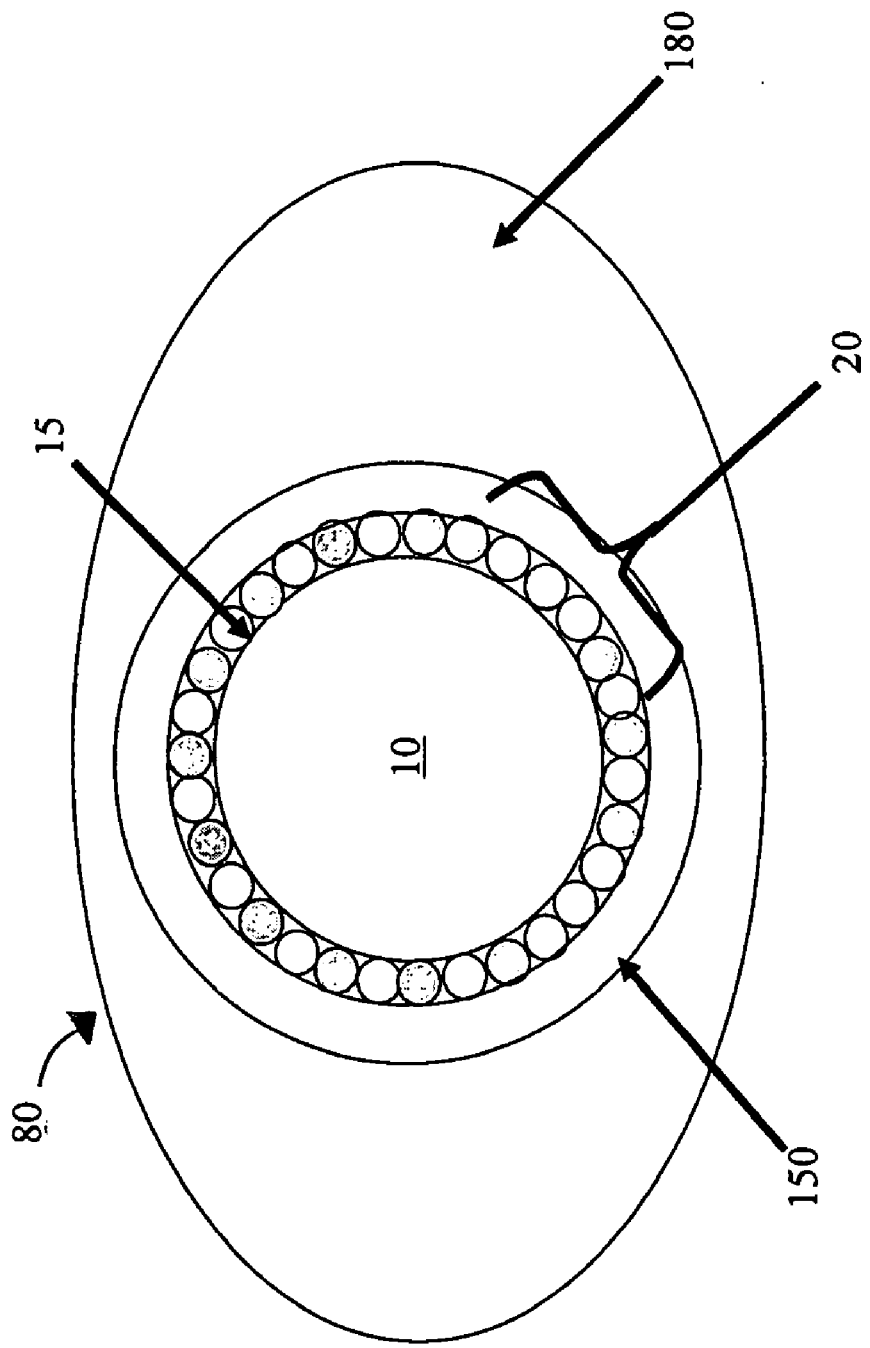
FIG. 5 is a schematic illustration of a semiconductor nanocrystal composite according to yet another embodiment of the present invention.

Referring to FIG. 5, in another alternate embodiment, the present invention additionally provides for a semiconductor nanocrystal composite comprising a semiconductor nanocrystal composition having one or more metal layers 20 formed on the outer surface 15 of the core 10 after synthesis of the core and a shell 150 overcoating the metal layer 20, the semiconductor nanocrystal composition being dispersed in an inorganic matrix material 180.

An alternative to shelling the semiconductor nanocrystal core that can result in an outer coating of a desired semiconductor material is through the addition of a chalcagonide, pnictide or a non-metal anion layer. The anion layer may be a layer of one or more anionic elements and does not include metallic compounds. The anion layer may include any number, type, combination, and arrangement of anions. For example, the anion layer may be simply a monolayer of anions. Non-limiting examples of elements that may comprise the anion layer include group IV, V, and VI elements. Optionally, after the formation of the anion layer, a metal layer may be added to the surface of the anion layer.

Semiconductor nanocrystal core, metal layer, and/or shell may be grown by the pyrolysis of organometallic precursors in a chelating ligand solution or by an exchange reaction using the prerequisite salts in a chelating ligand solution. The chelating ligands are typically lyophilic and have an affinity moiety for the semiconductor materials on the outer surface of the composition and another moiety with an affinity toward the solvent, which is usually hydrophobic, that the composition is in. Typical examples of chelating ligands include lyophilic surfactant molecules such as Trioctylphosphine oxide (TOPO), Trioctylphosphine (TOP), and Tributylphosphine (TBP).

As described above, during preparation, the semiconductor nanocrystals core, metal layer, and/or shell are enveloped by a layer of surfactant molecules having one or more functional groups that bind to the outer surface of the semiconductor nanocrystal composition and one or more moieties opposite the outer surface that have nonpolar functional groups with an affinity to hydrophobic solvents and/or polar or ionizable functional groups with an affinity to hydrophilic or aqueous solvents. The surfactant molecules that absorb mid-IR wavelengths are substantially replaced with an inorganic matrix material. A semiconductor nanocrystal composite 80 is thereby formed.

Figure 6:
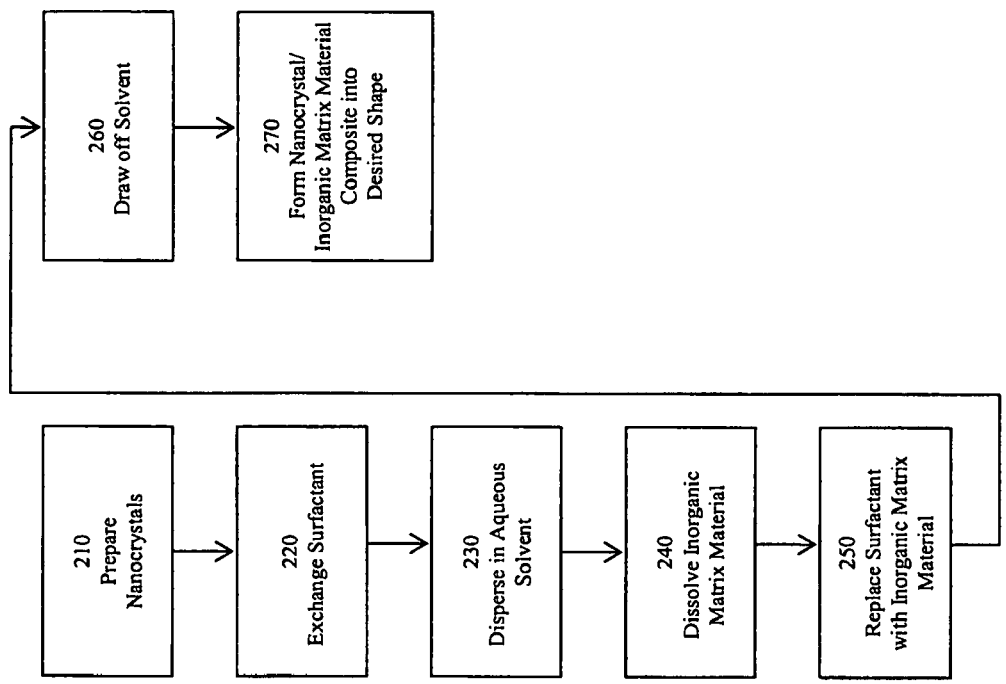
FIG. 6 is a flowchart of a method of making a semiconductor nanocrystal composite according to an embodiment of the present invention.

FIG. 6 provides an exemplary method of making a semiconductor nanocrystal composite of the present invention.

In step 210, semiconductor nanocrystal compositions are prepared. The prepared semiconductor nanocrystal compositions are enveloped in a chelating surfactant, where the surfactant has one or more nonpolar moieties with an affinity for a hydrophobic solvent, to form the semiconductor nanocrystal complex. Non-limiting examples of surfactants terminating in one or more nonpolar hydrophobic moieties include trioctylphoshphine oxide, trioctylphosphine, alkane thiols, alkane amines, and alkane carboxylic acids. Non-limiting examples of hydrophobic solvents include toluene, chloroform, and hexane.

In step 220, the surfactants terminating with nonpolar hydrophobic moieties are exchanged for metal chelating surfactants having one or more polar or ionizable functional groups in a typical exchange reaction by repeated precipitation of the complex from solution to remove the original surfactant having the nonpolar hydrophobic moieties and then resuspension of the complex with the surfactants having one or more polar or ionizable functional groups in solution. Non-limiting examples of metal chelating surfactants having one or more polar or ionizable groups include alkane thiol acids, undecanoic acid, octanoic acid, cysteine, histidine, etc.

Optionally, the initial surfactant may have one or more polar or ionizable functional groups, such that step 220 may be skipped.

In step 230, the semiconductor nanocrystal complex, having the hydrophilic surfactant molecules, is dispersed into an aqueous solvent. The aqueous solvent may be selected such that an inorganic matrix material may be dissolved into it.

In step 240, an inorganic matrix material is dissolved into the aqueous solvent in which the nanocrystal complex is dispersed. The inorganic matrix material has a neutral or slightly alkaline pH and, in the solid form, does not substantially absorb light having wavelengths between about 1 and about 10 microns and preferably between about 3 and about 5 microns or at the shorter wavelengths used to excite the nanocrystals. The inorganic matrix material is comprised of cations and anions having affinities for hydrogen ions or hydroxyl ions in aqueous solution. Some inorganic matrix material has cations and anions that have equivalent affinities for hydrogen and hydroxyl ions. Other inorganic matrix material, such as slightly alkaline material, has anions with slightly more affinity for hydrogen ions than their cations have for hydroxyl ions; while other inorganic matrix material has cations with slightly more affinity for hydroxyl ions than their anions have for hydrogen ions. Non-limiting examples of suitable matrix material are inorganic salts, inorganic oxides, and semiconductor material.

In step 250, the inorganic matrix material replaces the organic ligands present on the nanocrystal surface in a typical replacement reaction, causing the nanocrystals to precipitate along with some amount of inorganic matrix material and/or either the cation or the anion which comprises the matrix material, resulting in the nanocrystals being dispersed in the matrix material. The semiconductor nanocrystal composite precipitation can be accelerated through centrifugation, stirring, sonication or other methods known in the art.

In step 260, following precipitation of the semiconductor nanocrystal composite, the aqueous solvent is drawn off. Subsequent washing with pure aqueous solvent may be used.

In step 270, the composite may be formed into a desired shape through compressing the composite in a mold at high pressure. Such methods are known in the art and frequently used to make IR transparent windows used in spectroscopy instrumentation.

EXAMPLES

Example 1

Making a Semiconductor Nanocrystal Composite

A CdSe/ZnS nanocrystal core/shell composition is prepared or purchased. The initial surfactant used to prepare the composition is replaced with a polar ionized surfactant, mercaptoundecanoic acid. This is done by precipitating 10 mg of nanocrystal composition in 3 ml of methanol, then resuspending the nanocrystal composition in 4 ml of chloroform. To this resuspension solution is added 0.20 g of mercaptoundecanoic acid. The solution is sonicated for 20 minutes, resulting in the precipitation of the nanocrystal composition. The solution is centrifuged for 5 minutes and the supernatant discarded. The precipitated nanocrystal composition is then resuspended in methanol, producing a cloudy solution. The solution clears with the addition of about 0.2 g of teramethylammonium hydroxide. 10 ml of anhydrous diethyl ether is added to the solution, resulting in the precipitation of the nanocrystal composition. The solution is centrifuged and the supernatant discarded. The precipitated nanocrystal composition is dried in a stream of nitrogen to remove residual ether. The nanocrystal composition is then resuspended in 1 ml of water to produce a clear solution.

1 g of sodium chloride is added to a 10 mg sample of the nanocrystal composition solution in 20 ml of water. The salt-nanocrystal composition solution is mixed and then left standing for 15 minutes in order for the sodium chloride to replace the mercaptoundecanoic acid. The salt-nanocrystal composition solution is then centrifuged for 5 minutes to assist the nanocrystal composite to precipitate out of solution. The resulting supernatant is discarded. The nanocrystal composite precipitate is washed with water several times to remove any excess sodium chloride. The nanocrystal composite precipitate is dried in a vacuum oven at 50° C. for 60 minutes.

Example 2

Making a Semiconductor Nanocrystal Composite

A PbS nanocrystal composition is prepared or purchased. The initial surfactant used to prepare the composition is replaced with toluene to form a 2 mg/ml solution. 1 g of salt is dissolved in 15 ml of water. The salt solution is added to 5 ml of the 2 mg/ml solution of PbS nanocrystal composition in toluene while stirring vigorously. The salt-nanocrystal composition solution is covered and stirred overnight to precipitate out the nanocrystal composite. All the solvent is removed by drying in a vacuum oven at 50° C. for approximately 60 minutes. Once the precipitate is dry, it is resuspended in water and centrifuged to assist precipitation of the composite. The supernatant is discarded. The precipitate is washed with water three times to remove any excess salt. The nanocrystal composite precipitate is dried in a vacuum over at 50° C. for 60 minutes.

The foregoing description and examples have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

We claim:

1. A method of making a semiconductor nanocrystal composite, comprising:
    providing a semiconductor nanocrystal composition comprising a semiconductor nanocrystal core;
    providing a surfactant on the outer surface of the semiconductor nanocrystal composition; and
    replacing the surfactant with an inorganic matrix material, wherein the semiconductor nanocrystal composite emits light at wavelengths from about 1 to about 10 microns and the inorganic matrix material comprises an outer surface of the semiconductor nanocrystal composite.

2. The method of claim 1, wherein the semiconductor nanocrystal composite emits light at wavelengths from about 3 to about 5 microns.

3. The method of claim 1, wherein the inorganic matrix material is substantially non-absorbent of light at wavelengths from about 3 to about 5 microns.

4. The method of claim 1, wherein providing a surfactant comprises:
    providing an organic surfactant having a moiety with an affinity for the semiconductor nanocrystal core and another moiety with an affinity for a hydrophobic solvent.

5. The method of claim 4, further comprising:
    replacing the organic surfactant with a second surfactant that has a moiety with an affinity for the semiconductor nanocrystal core and another moiety with an affinity for a hydrophilic solvent.

6. The method of claim 1, wherein providing a semiconductor nanocrystal composition comprises:
    forming a shell of a semiconductor material on the outer surface of the semiconductor nanocrystal core.

7. The method of claim 1, wherein providing a semiconductor nanocrystal composition comprises:
    forming a metal layer on the outer surface of the semiconductor nanocrystal core.

8. The method of claim 7, wherein providing a semiconductor nanocrystal composition comprises:
    overcoating the metal layer with a shell of a semiconductor material.

9. The method of claim 1, wherein replacing the surfactant comprises:
    dispersing the semiconductor nanocrystal composition and the surfactant in an aqueous solvent;
    dissolving the inorganic matrix material in the aqueous solvent; and
    replacing the surfactant with the inorganic matrix material on the outer surface of the semiconductor nanocrystal composition.

10. A semiconductor nanocrystal composite comprising:
    a semiconductor nanocrystal composition dispersed in an inorganic matrix material, wherein the semiconductor nanocrystal composite emits light at a peak wavelength from about 1 to about 10 microns and wherein the inorganic matrix material is in contact with an outer surface of the nanocrystal composition and forms an outer surface of the nanocrystal composite.

11. The semiconductor nanocrystal composite of claim 10, wherein the semiconductor nanocrystal composite emits light at wavelengths from about 3 to about 5 microns.

12. The semiconductor nanocrystal composite of claim 10, wherein the inorganic matrix material has a neutral or slightly alkaline pH in solid form.

13. The semiconductor nanocrystal composite of claim 10, wherein the inorganic matrix material is substantially non-absorbent of the light at wavelengths from about 3 to about 5 microns.

14. The semiconductor nanocrystal composite of claim 10, wherein the semiconductor nanocrystal composition comprises:
    a semiconductor nanocrystal core; and
    a shell of a semiconductor material overcoating the outer surface of the semiconductor nanocrystal core.

15. The semiconductor nanocrystal composite of claim 10, wherein the semiconductor nanocrystal composition comprises:
    a semiconductor nanocrystal core; and
    a metal layer formed on the outer surface of the semiconductor nanocrystal core.

16. The semiconductor nanocrystal composite of claim 15, wherein the semiconductor nanocrystal composition comprises:
    a shell of a semiconductor material overcoating the metal layer.

17. The semiconductor nanocrystal composite of claim 15, wherein the semiconductor nanocrystal composition comprises:
    an outer coating comprising an anion layer overcoating the metal layer.

18. The semiconductor nanocrystal composite of claim 10, wherein the semiconductor nanocrystal composite has a luminescent quantum yield of at least 10%.

19. The semiconductor nanocrystal composite of claim 10, wherein the semiconductor nanocrystal composite also emits light at wavelengths less than about 3 microns and more than about 5 microns.

* * * * *